United States Patent
Choi

(10) Patent No.: US 10,417,948 B2
(45) Date of Patent: Sep. 17, 2019

(54) STRETCHABLE DISPLAY DEVICE

(71) Applicant: SAMSUNG DISPLAY CO., LTD., Yongin-si, Gyeonggi-do (KR)

(72) Inventor: Minhoon Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 1 day.

(21) Appl. No.: 15/406,854

(22) Filed: Jan. 16, 2017

(65) Prior Publication Data
US 2017/0249886 A1 Aug. 31, 2017

(30) Foreign Application Priority Data
Feb. 25, 2016 (KR) .......................... 10-2016-0022823

(51) Int. Cl.
*G09G 3/20* (2006.01)
*H05K 1/02* (2006.01)
(Continued)

(52) U.S. Cl.
CPC .............. *G09G 3/20* (2013.01); *G09G 3/007* (2013.01); *H05K 1/0283* (2013.01);
(Continued)

(58) Field of Classification Search
CPC ...... G09G 3/007; G09G 3/20; G09G 2380/02; G09G 2340/0407; G09G 2310/08;
(Continued)

(56) References Cited

U.S. PATENT DOCUMENTS

| 7,397,443 B2 | 7/2008 | Sugiura |
| 8,860,203 B2 | 10/2014 | Lee et al. |
| 2014/0285639 A1 | 9/2014 | Gyoung et al. |
| 2015/0192986 A1 | 7/2015 | Yang |
| 2015/0356926 A1* | 12/2015 | Bae .......................... H01L 51/56 345/212 |
| 2016/0028043 A1* | 1/2016 | Kwon ................. H01L 51/5253 257/40 |

FOREIGN PATENT DOCUMENTS

| JP | 2002-116717 | 4/2002 |
| JP | 2003-215497 | 7/2003 |

(Continued)

OTHER PUBLICATIONS

Hong, et al., "How to stretch a display and maintain pixel resolution", 2014 SPIE.
(Continued)

*Primary Examiner* — Jimmy H Nguyen
(74) *Attorney, Agent, or Firm* — F. Chau & Associates, LLC

(57) ABSTRACT

A stretchable display device includes a first stretchable display panel and a second stretchable display panel overlapping the first stretchable display panel. The first stretchable display panel includes a first stretchable substrate having a first length and a plurality of first pixels spaced apart from one another on the first stretchable substrate. The second stretchable panel includes a second stretchable substrate and a plurality of second pixels spaced apart from one another on the second stretchable substrate. The first stretchable substrate is stretchable in a first direction to have a second length. When the first stretchable substrate is stretched to have the second length, the second pixels are each positioned between the plurality of first pixels when viewed from a plan view.

19 Claims, 4 Drawing Sheets

(51) Int. Cl.
 *G09G 3/00* (2006.01)
 *H01L 51/52* (2006.01)
 *H01L 27/32* (2006.01)
(52) U.S. Cl.
 CPC ............... *G09G 2300/023* (2013.01); *G09G 2300/0426* (2013.01); *G09G 2300/0439* (2013.01); *G09G 2310/08* (2013.01); *G09G 2320/068* (2013.01); *G09G 2340/0407* (2013.01); *G09G 2380/02* (2013.01); *H01L 27/3262* (2013.01); *H01L 51/5253* (2013.01)
(58) Field of Classification Search
 CPC ... G09G 2300/0439; G09G 2300/0426; G09G 2300/023; G09G 2320/068; H05K 1/0283; H01L 51/5253; H01L 27/3262
 USPC .................................................. 345/1.1, 4, 5
 See application file for complete search history.

(56) References Cited

FOREIGN PATENT DOCUMENTS

| KR | 10-2013-0046386 | 5/2013 |
| KR | 10-2014-0063306 | 5/2014 |
| KR | 10-2015-0081628 | 7/2015 |

OTHER PUBLICATIONS

Vosgueritchian, et al., "Light-emitting electronic skin", Nature Photonics, vol. 7, Oct. 2013, pp. 769-771.

\* cited by examiner

STRETCHABLE DISPLAY DEVICE

CROSS-REFERENCE TO RELATED APPLICATION

This application claims priority under 35 U.S.C. § 119 to Korean Patent Application No. 10-2016-0022823, filed on Feb. 25, 2016, in the Korean Intellectual Property Office, the disclosure of which is incorporated by reference herein in its entirety.

1. Technical Field

Exemplary embodiments of the present invention relate to a display device, and more particularly to a stretchable display device.

2. Discussion of Related Art

Flexible display devices may fold or roll. Stretchable display devices may stretch into various shapes. When a stretchable display device stretches, intervals between pixels may increase, thus reducing the resolution of the stretchable display device.

SUMMARY

One or more exemplary embodiments of the present invention include stretchable display devices that may maintain a resolution even when stretched.

According to one or more exemplary embodiments of the present invention, a stretchable display device includes a first stretchable display panel and a second stretchable display panel overlapping the first stretchable display panel. The first stretchable display panel includes a first stretchable substrate having a first length and a plurality of first pixels spaced apart from one another on the first stretchable substrate. The second stretchable panel includes a second stretchable substrate and a plurality of second pixels spaced apart from one another on the second stretchable substrate. The first stretchable substrate is stretchable in a first direction to have a second length. When the first stretchable substrate is stretched to have the second length, the second pixels are each positioned between the plurality of first pixels when viewed from a plan view.

The plurality of second pixels may be driven when the first stretchable substrate has the second length.

When the first stretchable substrate has the first length, the second stretchable substrate may include at least one curved portion between end portions of the second stretchable display panel in the first direction.

When the first stretchable substrate has the second length, the second stretchable substrate may have a substantially flat shape.

The stretchable display device may include a detector configured to detect a driving time at which the plurality of second pixels is driven and a controller configured to control the plurality of second pixels to be driven according to a detection result of the detector.

When the second stretchable substrate is stretched, the detector may measure a modulus of the second stretchable substrate. The driving time of the second pixels may be a time at which the modulus of the second stretchable substrate changes from a first gradient to a second gradient different from the first gradient.

A Young's modulus of the first stretchable substrate may be less than a Young's modulus of the second stretchable substrate.

The detector may measure flatness of the second stretchable substrate. A time at which the second stretchable substrate becomes substantially flat may be the driving time of the second pixels.

The detector may measure a length of the first stretchable substrate. A time at which the first stretchable substrate has the second length may be the driving time of the second pixels.

End portions of the second stretchable display panel in the first direction may each be coupled to corresponding end portions of the first stretchable display panel in the first direction.

A length of the second stretchable substrate in the first direction may be substantially the same as the second length when the second stretchable substrate is in a substantially flat state.

End portions of the first stretchable substrate in the first direction and end portions of the second stretchable substrate in the first direction may move substantially simultaneously.

The second stretchable display panel may include a plurality of second stretchable display panels arranged in parallel in the first direction.

The first stretchable display panel may include a plurality of islands arranged on the first stretchable substrate. Each of the plurality of first pixels may be positioned on an island of the plurality of islands.

The first stretchable display panel may include a plurality of display units that form the plurality of first pixels. Each of the plurality of display units may include at least one display device electrically connected to at least one thin-film transistor (TFT).

The first stretchable display panel may include a thin-film encapsulation layer configured to independently seal each of the plurality of display units.

Each of the plurality of display units may include a display region and a non-display region disposed outside the display region. A dam portion may be positioned in the non-display region and may surround at least a part of the display region.

The thin-film encapsulation layer may include at least one organic film and at least one inorganic film. An area of the at least one inorganic film may be greater than an area of the at least one organic film. The at least one inorganic film may cover the dam portion.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
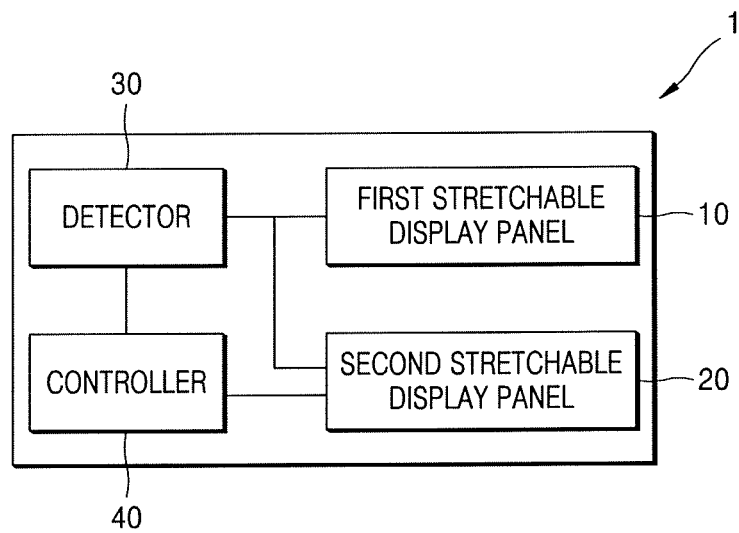
FIG. 1 is a block diagram illustrating components of a stretchable display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Like reference numerals may refer to like elements throughout the specification and drawings.

Figure 2:
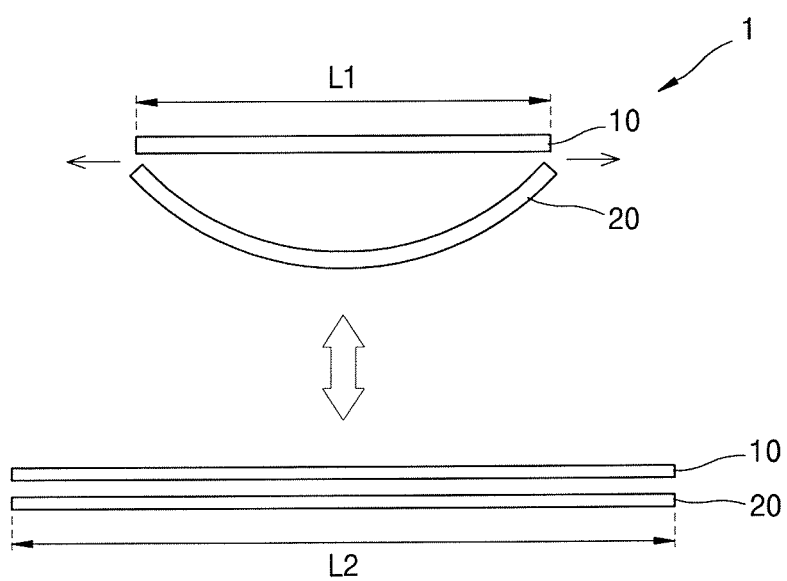
FIG. 2 is a cross-sectional view of the stretchable display device of FIG. 1.
Figure 3:
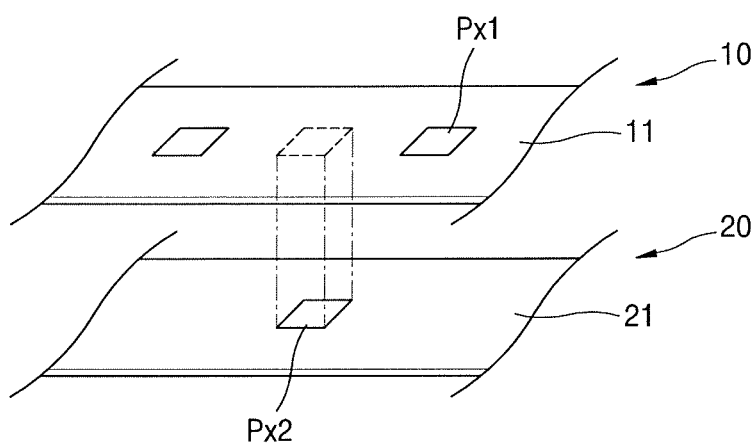
FIG. 3 is a perspective view illustrating elements when the stretchable display device of FIG. 2 stretches.
Figure 4:
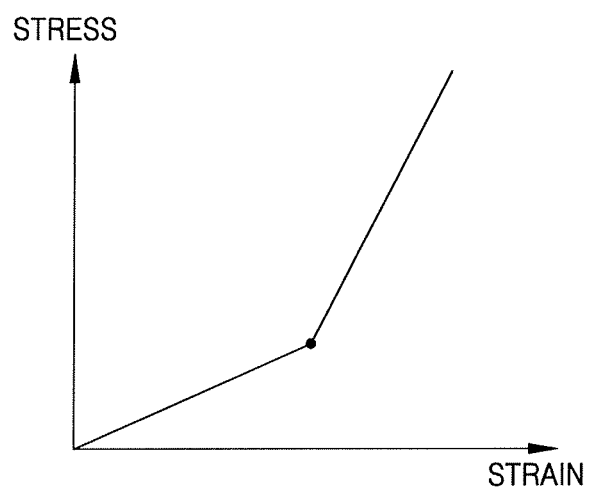
FIG. 4 is a graph illustrating a modulus of the stretchable display device of FIG. 2.

FIG. 1 is a block diagram illustrating components of a stretchable display device according to an exemplary embodiment of the present invention. FIG. 2 is a cross-sectional view of the stretchable display device 1 of FIG. 1. FIG. 3 is a perspective view illustrating elements when the stretchable display device 1 of FIG. 2 stretches. FIG. 4 is a graph illustrating a modulus of the stretchable display device 1 of FIG. 2.

Referring to FIGS. 1 through 3, a stretchable display device 1 according to an exemplary embodiment of the present invention may include a first stretchable display panel 10, a second stretchable display panel 20, a detector 30, and a controller 40.

The first stretchable display panel 10 may include a first stretchable substrate 11 having a first length L1 and a plurality of first pixels Px1 arranged on the first stretchable substrate 11. The first length L1 refers to a length of the first stretchable substrate 11 when no external force is applied to the first stretchable display panel 10. A length of the first stretchable substrate 11 may be substantially the same as a length of the first stretchable display panel 10, and thus a length of the first stretchable substrate 11 may refer to a length of the first stretchable display panel 10 as well as a length of the first stretchable substrate 11. A length of a second stretchable substrate 21 may be substantially the same as a length of the second stretchable display panel 20, and thus a length of the second stretchable substrate 21 may refer to a length of the second stretchable display panel 20 as well as a length of the second stretchable substrate 21.

The first stretchable substrate 11 may include a flexible material and the first stretchable substrate 11 may lengthen in a first direction. As the first stretchable substrate 11 lengthens in the first direction, an area of the first stretchable substrate 11 along the first direction may increase. The first stretchable substrate 11 may include a silicon-based polymer such as poly(dimethylsiloxane) (PDMS) or hexamethyldisiloxane (HMDSO); however, exemplary embodiments of the present invention are not limited thereto, and the first stretchable substrate 11 may include other flexible materials.

The plurality of first pixels Px1 may be spaced apart from one another on the first stretchable substrate 11. An interval between the plurality of first pixels Px1 may increase when the first stretchable substrate 11 stretches, and thus a resolution of the first stretchable display panel 10 may be reduced when the first stretchable substrate 11 stretches.

The second stretchable display panel 20 may overlap the first stretchable display panel 10. The second stretchable display panel 20 may include the second stretchable substrate 21 and a plurality of second pixels Px2 on the second stretchable substrate 21.

The second stretchable substrate 21 may include a material that is the same as or different from a material included in the first stretchable substrate 11. The second pixels Px2 may be spaced apart from one another on the second stretchable substrate 21.

Referring to FIG. 3, the second pixels Px2 may be disposed between the first pixels Px1 when the first stretchable substrate 11 stretches along the first direction. Thus, the first stretchable substrate 11 may include a material having a relatively high light transmittance.

For example, the second pixels Px2 may be arranged on the second stretchable substrate 21 so that the second pixels Px2 are between the first pixels Px1 when the interval between the first pixels Px1 increases when the first stretchable substrate 11 stretches in the first direction to have the second length L2.

The second pixels Px2 may be driven by a control signal of the controller 40.

Thus, a reduction in a resolution of the first stretchable display panel 10 due to the stretching of the first stretchable substrate 11 may be compensated for, and a resolution of the stretchable display device 1 may be maintained even when the stretchable display device 1 stretches.

When the first stretchable substrate 11 has the first length L1, the second stretchable substrate 21 may include at least one curved portion between end portions of the second stretchable display panel 20 in the first direction. The curved portion is not limited to a single curved portion or to a particular shape, and may have any of various shapes such as a wave shape. When the first stretchable substrate 11 has the second length L2, the second stretchable substrate 21 may have a flat shape.

A shape of the second stretchable substrate 21 may vary as the first stretchable substrate 11 expands and contracts. End portions of the second stretchable display panel 20 may each be fixedly coupled to corresponding end portions the first stretchable display panel 10.

Referring to FIGS. 2 and 3, when a length of the second stretchable substrate 21 is greater than the first length L1 and end portions of the second stretchable display panel 20 are each coupled to corresponding end portions of the first stretchable display panel 10, both end portions of the first stretchable substrate 11 and both end portions of the second stretchable substrate 21 may move together. End portions of the second stretchable display panel 20 may be directly adhered to corresponding end portions of the first stretchable display panel 10 or may be coupled to corresponding end portions of the first stretchable display panel 10 by using other elements.

Thus, when the first stretchable substrate 11 begins stretching in the first direction, end portions of the second stretchable display panel 20 may be moved gradually farther away from each other and the curved portion of the second stretchable substrate 21 may gradually widen and flatten. When the first stretchable substrate 11 has the second length L2, the first stretchable substrate 11 may have a substantially flat shape. When the first stretchable substrate 11 is longer than the second length L2, the second stretchable substrate 21 may extend along with the first stretchable substrate 11.

The controller 40 may control the second pixels Px2 to be driven according to a detection signal of the detector 30. The detector 30 may detect a driving time at which the second pixels Px2 are driven and may transmit information about the driving time to the controller 40.

According to an exemplary embodiment of the present invention, the detector 30 may detect a driving time of the second pixels Px2 by measuring a modulus of the stretchable display device 1. The modulus refers to a gradient in a stress-strain curve (see. e.g., FIG. 4).

When a length of the first stretchable substrate 11 increases from the first length L1 to the second length L2, the curved portion of the second stretchable substrate 21 may widen and flatten without substantially increasing a length of the second stretchable substrate 21. However, when a length of the first stretchable substrate 11 increases to be greater than the second length L2, both the first stretchable substrate 11 and the second stretchable substrate 21 may extend, and the length of each of the first stretchable substrate 11 and the second stretchable substrate 21 may increase. As an example, the second length L2 may be the same as a length of the second stretchable substrate 21, and thus at a time when a length of the first stretchable substrate 11 is greater than the second length L2, a modulus of the stretchable display device 1 may be changed. As an example, at a time when a length of the first stretchable substrate 11 is greater than the second length L2, a modulus of the stretchable display device 1 may increase, and the detector 30 may detect the time as a driving time of the second pixels Px2 and may transmit information about the driving time to the controller 40.

A Young's modulus of the first stretchable substrate 11 may be less than a Young's modulus of the second stretchable substrate 21. When a material has a low Young's modulus, the material may stretch relatively easily and may be referred to as having a low modulus. Thus, when a Young's modulus of the second stretchable substrate 21 is greater than a Young's modulus of the first stretchable substrate 11, the amount of change in a modulus of the stretchable display device 1 when the second stretchable substrate 21 begins to extend may increase and the sensing effect of the detector 31 may be increased.

As an example, the detector 30 may detect a driving time of the second pixels Px2 by measuring flatness of the second stretchable substrate 21. Since the second stretchable substrate 21 may flatten at a time when a length of the first stretchable substrate 11 is substantially the same as the second length L2, the detector 30 may detect a time when the second stretchable substrate 21 flattens as a driving time of the second pixels Px2.

As an example, the detector 30 may detect a driving time of the second pixels Px2 by measuring a length of the first stretchable substrate 11. The detector 30 may determine a time when a length of the first stretchable substrate 11 is substantially the same as the second length L2 as a driving time of the second pixels Px2.

The controller 40 may control the second pixels Px2 to be driven according to a detection signal of the detector 30. When a length of the first stretchable substrate 11 is greater than the second length L2, the second stretchable substrate 21 may extend along with the first stretchable substrate 11. The controller 40 may maintain a driving state of the second pixels Px2. Thus, a reduction in a resolution of the first stretchable display panel 10 may be compensated for when the stretchable display device 1 stretches, thus maintaining a resolution of the stretchable display device 1.

Figure 5:
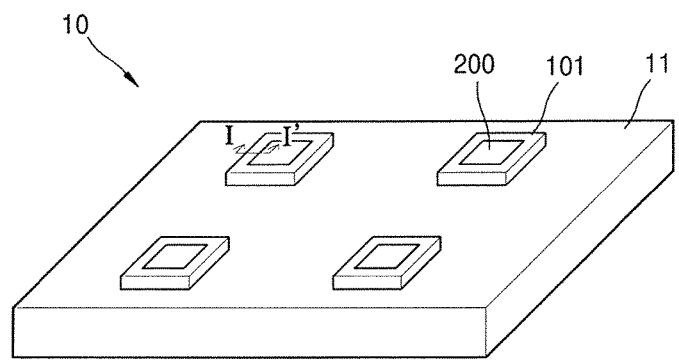
FIG. 5 is a perspective view of a first stretchable display panel of the stretchable display device of FIG. 2.
Figure 6:
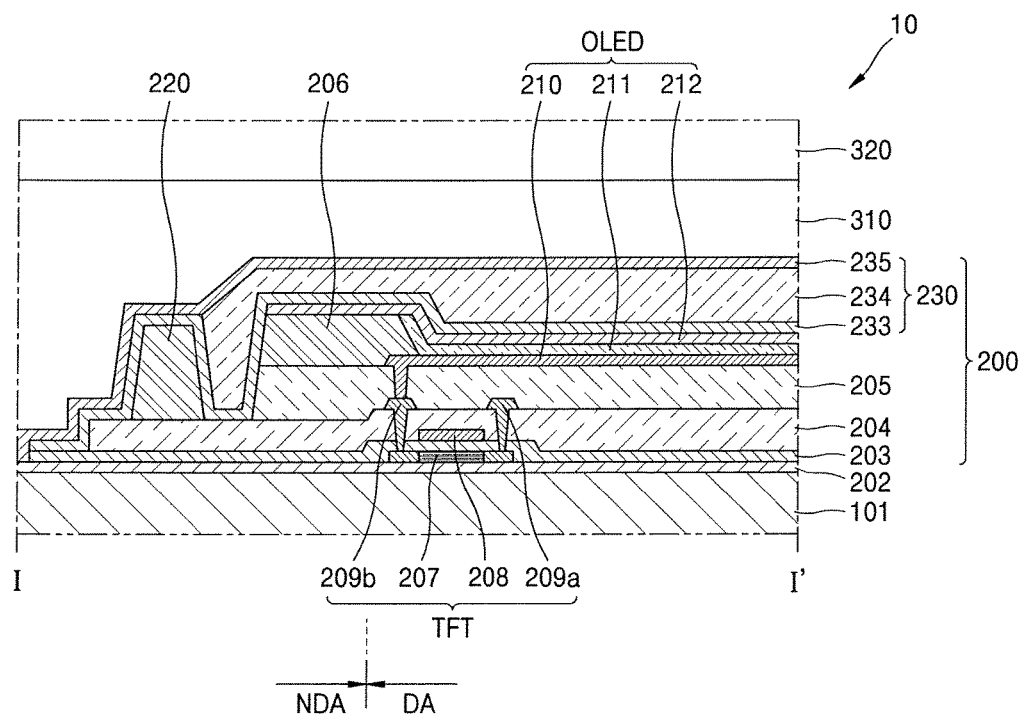
FIG. 6 is a cross-sectional view taken along line I-I' of FIG. 5.
Figure 7:
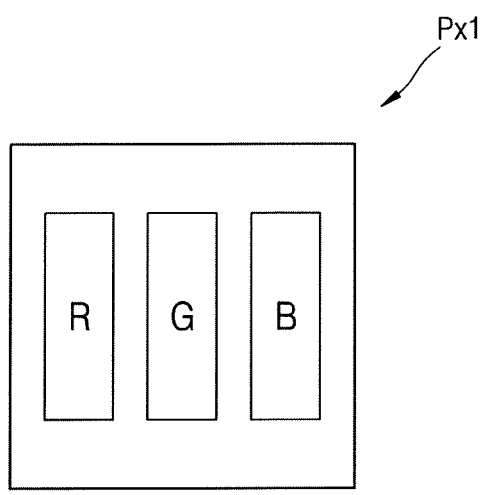
FIG. 7 is a plan view of a first pixel unit of FIG. 3.

FIG. 5 is a perspective view of the first stretchable display panel of the stretchable display device of FIG. 2. FIG. 6 is a cross-sectional view taken along line I-I' of FIG. 5. FIG. 7 is a plan view of a first pixel unit of FIG. 3.

Although the first stretchable display panel 10 will be described below with reference to FIGS. 5 through 7, the second stretchable display panel 20 may have substantially the same structure as that of the first stretchable display panel 10, as described with reference to FIGS. 5 through 7. Thus, duplicative descriptions may be omitted.

Referring to FIGS. 5 through 7, the first stretchable display panel 10 may include a plurality of islands 101 arranged on the first stretchable substrate 11. The plurality of first pixels Px1 may each be positioned on a respective island of the plurality of islands 101.

The plurality of islands 101 may be spaced apart from one another and may have substantially flat top surfaces. Display units 200 that form the plurality of first pixels Px1 may be positioned on the substantially flat top surfaces of the plurality of islands 101.

Areas of the first stretchable substrate 11 where the plurality of islands 101 are positioned may each have a thickness greater than areas of the first stretchable substrate 11 where the islands 101 are not positioned. Thus, the plurality of islands 101 may be deformed a relatively small amount when the first stretchable substrate 11 stretches. Thus, the plurality of display units 200 formed on the plurality of islands 101 may be prevented from separating from the plurality of islands 101 and positions of the plurality of display units 200 may be stably maintained.

The plurality of display units 200 may include a display region DA and a non-display region NDA disposed outside the display region DA. At least one light-emitting device for emitting, for example, red, blue, green, or white light may be positioned in the display region DA and may be electrically connected to a thin-film transistor (TFT). The light-emitting device may be an organic light-emitting device (OLED). However, exemplary embodiments of the present invention are not limited thereto, and the display units 200 may include a light-emitting diode (LED) or a liquid crystal device as the light-emitting device.

Referring to FIG. 6, a buffer layer 202 may be formed on each of the islands 101. The buffer layer 202 may planarize a top surface of the island 101 and may include an inorganic material such as silicon oxide, silicon nitride, silicon oxynitride, aluminum oxide, aluminum nitride, titanium oxide, or titanium nitride, or an organic material such as polyimide, polyester, or acryl. The buffer layer may include a plurality of stacked layers, each including at least one of the inorganic materials and/or at least one of the organic materials.

The TFT may be formed on the buffer layer 202. The TFT may include an active layer 207, a gate electrode 208, a source electrode 209$a$, and a drain electrode 209$b$.

The active layer 207 may include an inorganic semiconductor such as silicon or an organic semiconductor. The active layer 207 may include a source region, a drain region, and a channel region disposed between the source region and the drain region. For example, when the active layer 207 includes amorphous silicon, a polycrystalline silicon layer may be formed by forming an amorphous silicon layer on substantially an entire surface of the island 101 and crystallizing the amorphous silicon layer. The active layer 207 including the source region, the drain region, and the channel region disposed between the source region and the drain region may be formed by patterning the polycrystalline silicon layer and doping impurities into a to-be-source region and a to-be-drain region.

A gate insulating film 203 may be formed on the active layer 207. The gate insulating film 203 may insulate the active layer 207 from the gate electrode 208 and may include an inorganic material such as SiNx or $SiO_2$.

The gate electrode 208 may be formed on a predetermined portion of the gate insulating film 203. The gate electrode 208 may include gold (Au), silver (Ag), copper (Cu), nickel (Ni), platinum (Pt), palladium (Pd), aluminum (Al), or molybdenum (Mo), and may include an alloy such as Al:Nd or Mo:W. However, exemplary embodiments of the present invention are not limited thereto, and the gate electrode 208 may include any of various other materials.

An interlayer insulating film 204 may be formed on the gate electrode 208. The interlayer insulating film 204 may insulate the gate electrode 208 from the source electrode 209a and the drain electrode 209b and may include an inorganic material such as SiNx or $SiO_2$.

The source electrode 209a and the drain electrode 209b may be formed on the interlayer insulating film 204. As an example, the interlayer insulating film 204 and the gate insulating film 203 may expose the source region and the drain region of the active layer 207. The source electrode 209a and the drain electrode 209b may each contact at least one of the exposed source region or drain region. The source electrode 209a or the drain electrode 209b may be connected to a data line.

Each of the source electrode 209a and the drain electrode 209b may have a single-layer structure or a multi-layer structure. Each layer may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

The TFT may be a top-gate TFT sequentially including the active layer 207, the gate electrode 208, the source electrode 209a, and the drain electrode 209b; however, exemplary embodiments of the present invention are not limited thereto, and the gate electrode 208 may be disposed under the active layer 207.

The TFT may be covered and protected by a planarization film 205. The planarization film 205 may be an inorganic insulating film and/or an organic insulating film. The inorganic insulating film may include $SiO_2$, SiNx, SiON, $Al_2O_3$, $TiO_2$, $Ta_2O_5$, $HfO_2$, $ZrO_2$, BST, or PZT, and the organic insulating film may include a general purpose polymer (e.g., poly(methyl methacrylate) (PMMA) or polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof. The planarization film 205 may be formed by stacking together the inorganic insulating film and the organic insulating film.

The OLED may be formed on the planarization film 205. The OLED may include a first electrode 210, an intermediate layer 211, and a second electrode 212.

The first electrode 210 may be formed on the planarization film 205, and may be electrically connected to the source electrode 209a or the drain electrode 209b through a contact hole formed in the planarization film 205.

The first electrode 210 may be a reflective electrode, and may include a reflective film including Ag, Mg, Al, Pt, Pd, Au, Ni, Nd, Ir, Cr, or a compound thereof, and a transparent or semi-transparent electrode layer formed on the reflective film. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

The second electrode 212 disposed to face the first electrode 210 may be a transparent or semi-transparent electrode, and may include a metal thin film having a relatively low work function including Li, Ca, LiF/Ca, LiF/Al, Al, Ag, Mg, or a compound thereof. An auxiliary electrode layer or a bus electrode may be formed on the metal thin film. The auxiliary electrode layer or the bus electrode may include a transparent electrode forming material such as ITO, IZO, ZnO, or $In_2O_3$.

Thus, the second electrode 212 may allow light emitted from an organic emission layer included in the intermediate layer 211 to be transmitted therethrough. As an example, light emitted from the organic emission layer may be directly emitted to the second electrode 212 or may be reflected by the first electrode 210, which is a reflective electrode, to the second electrode 212.

However, the display unit 200 according to an exemplary embodiment of the present invention is not limited to a top-emission display unit, and may be a bottom-emission display unit in which light emitted from the organic emission layer is emitted to the island 101. In this case, the first electrode 210 may be a transparent or semi-transparent electrode, and the second electrode 212 may be a reflective electrode. The display unit 200 according to an exemplary embodiment of the present invention may be a dual-emission display unit in which light is emitted to both a top surface and a bottom surface of the display unit.

A pixel-defining film 206 including an insulating material may be formed on the first electrode 210. The pixel-defining film 206 may include at least one organic insulating material selected from polyimide, polyamide, acrylic resin, benzocyclobutene, or phenolic resin, and may be formed by spin coating. The pixel-defining film 206 may expose a predetermined portion of the first electrode 210. The intermediate layer 211 including the organic emission layer may be disposed on the exposed predetermined portion of the first electrode 210.

The organic emission layer included in the intermediate layer 211 may include a relatively low molecular weight organic material or a relatively high molecular weight organic material. The intermediate layer 211 may include a functional layer such as a hole transport layer (HTL), a hole injection layer (HIL), an electron transport layer (ETL), or an electron injection layer (EIL) in addition to the organic emission layer.

A thin-film encapsulation layer 230, which may seal the display unit 200, may be formed on the second electrode 212. The thin-film encapsulation layer 230 may block external oxygen and moisture and may have a single-layer or multi-layer structure.

For example, the thin-film encapsulation layer 230 may include at least one inorganic film and at least one organic film that are alternately stacked. The thin-film encapsulation layer 230 may include first and second inorganic films 233 and 235 and an organic film 234; however, exemplary embodiments of the present invention are not limited thereto. As an example, the thin-film encapsulation layer 230 may include a plurality of additional inorganic films and organic films that are alternately stacked and the number of times the inorganic films and the organic films are stacked is not limited to a particular number of times.

Each of the first and second inorganic films 233 and 235 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The organic film 234 may planarize a stepped portion formed by the pixel-defining film 206, and may reduce stress applied by the first and second inorganic films 233 and 235. The organic film 234 may include PMMA, polycarbonate (PC), PS, acrylic resin, epoxy resin, polyimide, or polyethylene.

Each of the first and second inorganic films 233 and 235 may have an area greater than that of the organic film 234. Thus, the first and second inorganic films 233 and 235 may be in direct contact with each other outside the organic film 234, which may reduce or prevent a penetration of external oxygen or moisture into the organic film 234.

The thin-film encapsulation layer 230 may be independently formed on each of the plurality of display units 200. As an example, when the first stretchable display panel 10 includes n display units 200, n thin-film encapsulation films 230 may be formed.

A protective film 320 may be formed on the thin-film encapsulation layer 230. The protective film 320 may reduce or prevent a penetration of foreign materials into the first stretchable display panel 10. The protective film 320 may extend when the first stretchable display panel 10 stretches. For example, the protective film 320 may include PDMS; however, exemplary embodiments of the present invention are not limited thereto. The protective film 320 may be attached to the thin-film encapsulation layer 230 by an adhesive layer 310.

A dam portion 220 that surrounds at least a part of the display region DA may be formed in the non-display region NDA of the display unit 200.

When the organic film 234 of the thin-film encapsulation layer 230 is formed, the dam portion 220 may prevent an organic material for forming the organic film 234 from flowing to an edge of the island 101 and thus may prevent the organic film 234 from forming a tail edge. Thus, the organic film 234 may face or be in direct contact with an inner surface of the dam portion 220. The organic film 234 may overlap a part of the dam portion 220 and need not extend outward beyond the dam portion 220.

The first and second inorganic films 233 and 235 may cover the dam portion 220, and end portions of the first and second inorganic films 233 and 235 may be disposed closer to the edge of the island 101 than the dam portion 220. Thus, the encapsulation characteristics of the thin-film encapsulation layer 230 may be prevented from being reduced or removed when edges of the first and second inorganic films 233 and 235 are separated in the non-display region NDA.

The dam portion 220 may include a same material as that of at least one layer between the gate insulating film 203 and the pixel-defining film 206. As an example, the dam portion 220 may include a same material as that of the pixel-defining film 206.

For example, the dam portion 220 may include a first layer including a same material as that of the planarization film 205 and a second layer including a same material as that of the pixel-defining film 212 on the first layer. However, exemplary embodiments of the present invention are not limited thereto, and the dam portion 220 may have a single-layer structure. The dam portion 220 may include a plurality of dam portions 220. When the dam portion 220 includes the plurality of dam portions 220, the dam portions 220 may have greater heights toward the edge of the island 101.

The display unit 200 may include one OLED for emitting red, blue, green, or white light, or may include a plurality of the OLEDs for emitting different colors of light. For example, the display unit 200 may form one first pixel Px1 by including an OLED for emitting red (R) light, an OLED for emitting the green (G) light, and an OLED for emitting blue (B) light. Although the OLEDs may be arranged in an RGB structure, exemplary embodiments of the present invention are not limited thereto and the OLEDs may be arranged in a pentile structure or a beehive structure according to the efficiency of a material included in the organic emission layer.

Figure 8:
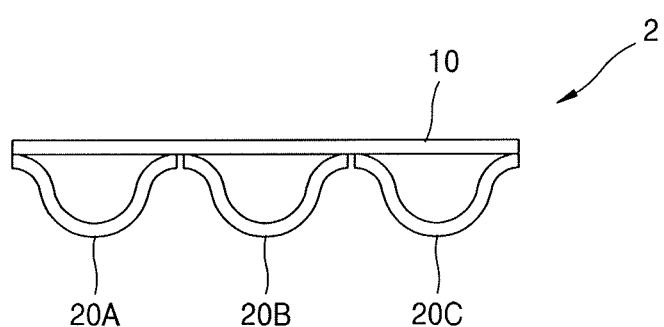
FIG. 8 is a cross-sectional view illustrating a stretchable display device according to an exemplary embodiment of the present invention.

FIG. 8 is a cross-sectional view illustrating a stretchable display device according to an exemplary embodiment of the present invention.

Referring to FIG. 8, a stretchable display device 2 may include the first stretchable display panel 10 and second stretchable display panels 20A, 20B, and 20C overlapping the first stretchable display panel 10. The first stretchable display panel 10 may be substantially the same as the first stretchable display panel described above, and thus duplicative descriptions may be omitted.

The second stretchable display panels 20A, 20B, and 20C may be arranged in parallel in a first direction in which the stretchable display device 2 stretches. End portions of each of the second stretchable display panels 20A, 20B, and 20C in the first direction may be fixedly coupled to the first stretchable display panel 10. For example, the end portions of the second stretchable display panels 20A, 20B, and 20C may be attached to the first stretchable display panel 10.

When an external force is not applied to the first stretchable display panel 10, each of the second stretchable display panels 20A, 20B, and 20C may include at least one curved portion. However, when an external force is applied to the first stretchable display panel 10 and the first stretchable display panel 10 stretches along the first direction, the second stretchable display panels 20A, 20B, and 20C may flatten and the second pixels Px2 included in each of the second stretchable display panels 20A, 20B, and 20C may be positioned between the first pixels Px1. The controller 40 may control the second pixels Px2 to be driven according to a detection signal of the detector 30. Thus, even when the stretchable display device 2 stretches, a resolution of the stretchable display device 2 may be maintained.

When the second stretchable display panels 20A, 20B, and 20C are arranged in parallel in the first direction, a thickness of the stretchable display device 2 may be prevented from increasing. Since the first stretchable display panel 10 may extend at least until all of the second stretchable display panels 20A, 20B, and 20C flatten, an extension length of the stretchable display device 2 may increase. When lengths of the second stretchable display panels 20A, 20B, and 20C are different from one another, portions where reductions in resolutions of the first stretchable display panel 10 are compensated for may be divided according to positions of the second stretchable display panels 20A, 20B, and 20C, and the reductions in the resolutions may be sequentially compensated for.

For example, when a length of the second stretchable display panel 20B located at a central portion is shorter than that of the second stretchable display panels 10A and 20C, a reduction in a resolution of the central portion at which the second stretchable display panel 20B is positioned may be first compensated for when the stretchable display device 2 stretches. Thus, even when a length of the stretchable display device 2 increases, a user might not recognize the reduction in the resolution when the stretchable display device 2 stretches.

According to the one or more exemplary embodiments of the present invention, a resolution may be maintained even when a stretchable display device stretches.

While one or more example embodiments have been described with reference to the figures, it will be understood by those of ordinary skill in the art that various changes in form and details may be made therein without departing from the spirit and scope of the present invention.

What is claimed is:

1. A stretchable display device comprising:
a first stretchable display panel; and
a second stretchable display panel overlapping the first stretchable display panel,
wherein the first stretchable display panel includes a first stretchable substrate having a first length and a plurality of first display units spaced apart from one another on the first stretchable substrate, and
the second stretchable panel includes a second stretchable substrate and a plurality of second display units spaced apart from one another on the second stretchable substrate,
wherein the first stretchable substrate is stretchable in a first direction to have a second length,
when the first stretchable substrate is stretched to have the second length, the second display units are each positioned between the plurality of first display units when viewed from a plan view, and
wherein the plurality of second display units are driven when the first stretchable substrate has a length at least as long as the second length, and wherein the plurality of second display units are not driven when the first stretchable substrate has the first length,
wherein a length of the second stretchable substrate in the first direction is the same as the second length when the second stretchable substrate is in a flat state.

2. The stretchable display device of claim 1, wherein when the first stretchable substrate has the first length, the second stretchable substrate comprises a curved portion between end portions of the second stretchable display panel in the first direction.

3. The stretchable display device of claim 2, wherein when the first stretchable substrate has the second length, the second stretchable substrate has a flat shape.

4. The stretchable display device of claim 3, further comprising a detector configured to detect a driving time at which the plurality of second display units are driven and a controller configured to control the driving of the plurality of second display units according to a detection result of the detector.

5. The stretchable display device of claim 4, wherein when the second stretchable substrate is stretched, the detector measures a modulus of the second stretchable substrate, and
wherein the driving time of the second display units is a time at which the modulus of the second stretchable substrate changes from a first gradient to a second gradient different from the first gradient.

6. The stretchable display device of claim 5, wherein a Young's modulus of the first stretchable substrate is less than a Young's modulus of the second stretchable substrate.

7. The stretchable display device of claim 4, wherein the detector measures flatness of the second stretchable substrate, and
wherein a time during which the second stretchable substrate is flat is an amount of time during which the second display units are driven.

8. The stretchable display device of claim 4, wherein the detector measures a length of the first stretchable substrate, and
wherein a time during which the first stretchable substrate has the second length is an amount of time during which the second display units are driven.

9. The stretchable display device of claim 3, wherein the end portions of the second stretchable display panel in the first direction are each coupled to corresponding end portions of the first stretchable display panel in the first direction.

10. The stretchable display device of claim 9, wherein the end portions of the first stretchable substrate in the first direction and the end portions of the second stretchable substrate in the first direction move simultaneously.

11. The stretchable display device of claim 3, wherein a plurality of second stretchable display panels are arranged in parallel in the first direction.

12. The stretchable display device of claim 1, wherein the first stretchable display panel includes a plurality of islands arranged on the first stretchable substrate, and
wherein each of the plurality of first display units is positioned on an island of the plurality of islands.

13. The stretchable display device of claim 12, wherein each of the plurality of first display units and the plurality of second display units is electrically connected to a thin-film transistor (TFT).

14. The stretchable display device of claim 1, wherein the first stretchable display panel includes a thin-film encapsulation layer configured to independently seal each of the plurality of display units.

15. The stretchable display device of claim 1, wherein each of the first and second display units comprises a display region and a non-display region disposed outside the display region, and a dam portion positioned in the non-display region and surrounding at least a part of the display region.

16. The stretchable display device of claim 15, wherein the thin-film encapsulation layer comprises at least one organic film and at least one inorganic film, and
wherein an area of the at least one inorganic film is greater than an area of the at least one organic film, and the at least one inorganic film covers the dam portion.

17. A display device, comprising:
a first stretchable display panel comprising a first stretchable substrate having a first length in a non-stretched state, wherein the first stretchable substrate is stretchable in a first direction to at least a second length greater than the first length;
a second stretchable display panel comprising a second stretchable substrate having the second length, wherein the second stretchable substrate is stretchable in the first direction,
wherein end portions of the first stretchable substrate are each coupled to corresponding end portions of the second stretchable substrate, and wherein the second stretchable substrate includes a curved portion when the first stretchable substrate is in a non-stretched state;
a plurality of first pixels arranged on the first stretchable substrate; and
a plurality of second pixels arranged on the second stretchable substrate,
wherein when the first stretchable substrate is stretched in the first direction, the second stretchable substrate flattens until it reaches a flat state, wherein when the first stretchable substrate is stretched to the second length, each of the second pixels is spaced apart from each of the first pixels when viewed from a plan view, wherein the plurality of second pixels are driven when the first stretchable substrate has a length at least as long as the second length, and wherein the plurality of second pixels are not driven when the first stretchable substrate has a length shorter than the second length, and wherein a length of the second stretchable substrate in the first direction is the same as the second length when the second stretchable substrate is in the flat state.

18. The display device of claim 17, wherein the plurality of second pixels are driven when the second stretchable substrate has a length greater than the second length.

19. A stretchable display device comprising:
a first stretchable display panel; and
a second stretchable display panel overlapping the first stretchable display panel,
wherein the first stretchable display panel includes a first stretchable substrate having a first length and a plurality of first pixels spaced apart from one another on the first stretchable substrate, and
the second stretchable panel includes a second stretchable substrate and a plurality of second pixels spaced apart from one another on the second stretchable substrate, wherein the first stretchable substrate is stretchable in a first direction to have a second length, when the first stretchable substrate is stretched to have the second length, the second pixels are each positioned between the plurality of first pixels when viewed from a plan view, wherein the plurality of second pixels are driven when the first stretchable substrate has a length at least as long as the second length, wherein the plurality of second pixels are not driven when the first stretchable substrate has a length shorter than the second length, wherein a length of the second stretchable substrate in the first direction is the same as the second length when the second stretchable substrate is in a flat state, and wherein when the first stretchable substrate has the first length, the second stretchable substrate comprises a curved portion between end portions of the second stretchable display panel in the first direction.

* * * * *